United States Patent [19]

Main

[11] 4,385,341
[45] May 24, 1983

[54] STRAIN RELIEF MEMBER FOR FLAT FLEXIBLE CABLES

[75] Inventor: Henry A. Main, London, Canada

[73] Assignee: Northern Telecom Limited, Montreal, Canada

[21] Appl. No.: 245,500

[22] Filed: Mar. 19, 1981

[51] Int. Cl.³ .............................................. H05K 1/18
[52] U.S. Cl. .................................. 361/403; 174/68.5; 174/135; 174/138 G; 339/17 LC; 361/408
[58] Field of Search ................ 174/88 R, 117 F, 135, 174/138 G, 68.5; 361/403, 408, 418; 339/17 LC, 17 F, 103 R, 103 M, 107

[56] References Cited

U.S. PATENT DOCUMENTS

| 2,967,284 | 1/1961 | Bailey | 174/68.5 X |
| 3,496,514 | 2/1970 | Gallentine | 339/17 L |
| 3,573,719 | 4/1971 | Lightner | 339/17 L X |
| 4,139,727 | 2/1979 | Kuballa | 174/135 X |

FOREIGN PATENT DOCUMENTS

| 2428882 | 1/1976 | Fed. Rep. of Germany | 174/68.5 |
| 374776 | 6/1973 | U.S.S.R. | 174/68.5 |

OTHER PUBLICATIONS

J. D. Dwire, Cable-To-Card Connector Assembly, IBM Tech. Disc. Bull., vol. 18, #1, Jun. 1975, pp. 216 & 217.
S. M. Meiboom, Miniature Contacts for Pluggable Modules, IBM Tech. Disc. Bull., V. #5 #5, Oct. 1962, pp. 24 & 25.
Circon Application Notes from catalog C-101, Nov. 1954.

Primary Examiner—R. R. Kucia
Attorney, Agent, or Firm—Sidney T. Jelly

[57] ABSTRACT

To prevent breakage of flexible conductors of a flat cable soldered to the printed circuit on a printed circuit board, a strain relief member is provided through which the conductors pass, prior to passing through the board to the printed circuit. The relief member has a longitudinal groove extending part way through the member and apertures extending from the bottom of the groove to the bottom surface of the relief member. Bared conductors pass through the apertures and through the board to be soldered to the printed circuit. The end of the insulated portion of the cable is positioned in the groove. The relief member is held in firm contact with the printed circuit board during soldering. Use of the relief member moves the flexing position of the cable away from the end of the "wicking" of the solder up the conductors during soldering.

7 Claims, 7 Drawing Figures

STRAIN RELIEF MEMBER FOR FLAT FLEXIBLE CABLES

This invention relates to strain relief members for flat flexible cables having a plurality of flexible conductors positioned side-by-side and is particularly concerned with such relief members for use in connection of flat cables to printed circuit boards, and to such circuit boards with strain relief members and flat cables connected thereto.

For reasons of cost, it is desirable to flow-solder the conductors of a flat cable to the circuit of a circuit carrying member, for example a printed circuit board (PCB). In particularly such flow soldering is done at the same time as other components are soldered. Solder tends to creep or "wick" up the strands of the conductors to a position which is approximately level with the surface of the PCB remote from the conductor pattern. The cable tends to flex at the point where the solder "wicking" stops. Flexing of the cable a very few times, for example five or six times, during manufacture and assembly can cause one or more conductors to break close to the PCB. This either requires replacement of the cable which is expensive, or scrapping of the PCB, also very expensive.

It has been proposed to mechanically attach the flexible cable to the PCB at some position remote from the solder attachment but this is inconvenient, takes up space on the PCB and is generally undesirable.

The present invention provides an extremely simple and cheap strain relief applied on assembly of the cable to the PCB. The strain relief of the present invention is a loose plastic member which slides over the exposed ends of the conductors prior to the conductors being inserted through the PCB. The strain relief extends up from the PCB to move the flexing position away from the surface of the PCB and away from the end of the "wicking" of the solder. Generally a strain relief member comprises an elongate plastic member having a base surface for positioning on a surface of the PCB, a slot extending the length of the member, the slot extending in from a top surface spaced from the base surface, and apertures extending from the bottom of the slot to the base surface. The length of the member may vary. The invention also relates to a PCB having a conductor pattern on a bottom surface, and a flexible cable with a strain relief member on the top surface of the PCB, the conductors extending through to PCB and soldered to the conductor pattern.

The invention will be readily understood by the following description of an embodiment, by way of example, and variations thereof, in conjunction with the accompanying drawings, in which.

Figure 1:
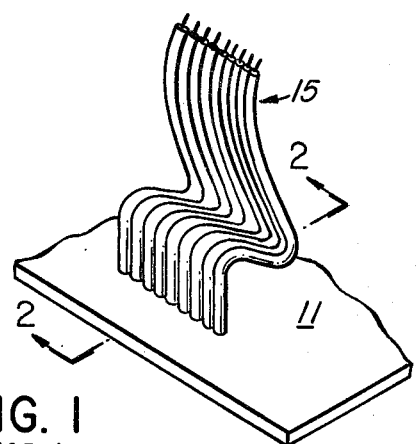
FIG. 1 is a perspective view of a flexible cable attached to a PCB, in the conventional manner.
Figure 2:
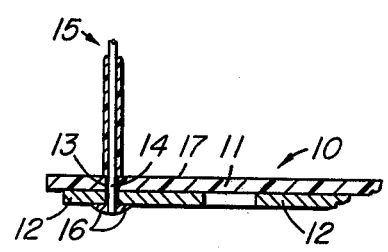
FIG. 2 is a cross-section on the line 2—2 of FIG. 1.

As illustrated in FIGS. 1 and 2, a PCB 10 comprises a sheet of insulating material 11 with a conductor pattern 12 on one surface thereof. The material 11 is shown in FIG. 2 as being entirely of insulating material, for example glass fiber reinforced resin. However other forms of sheet material can be used.

The individual conductors are prepared by removing the insulation for a predetermined length and the conductors then inserted through the holes 13. The conductor ends are then flow soldered to the conductor pattern 12, as indicated at 16. The flow soldering is usually carried out at the same time as soldering of the components carried by the PCB.

The conductors 14 are composed of a plurality of fine wires and on soldering, solder tends to creep or "wick" up the conductors to a position approximately level with the top surface 17 of the PCB. This forms a concentrated flexing position in the conductors and breakage can occur after a very few flexures, as few as five or six. This number of flexures can readily be attained during manufacture of the PCB and assembly of the PCB into an apparatus. Even if only one conductor breaks, the cable is of no use. Either the cable is removed by unsoldering the conductors by hand and resoldering another cable in place again by hand, or the PCB is scrapped. In either case there is a considerable expense involved.

Figure 3:
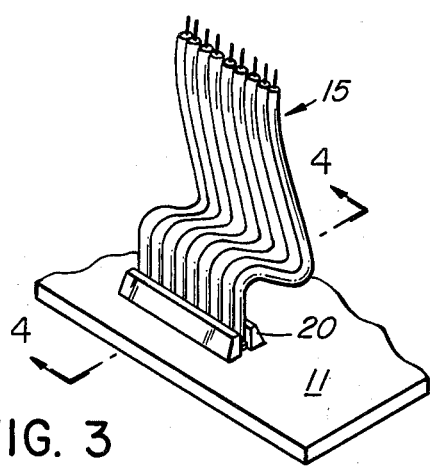
FIG. 3 is a perspective view of a flexible cable attached to a PCB in accordance with the present invention.
Figure 4:
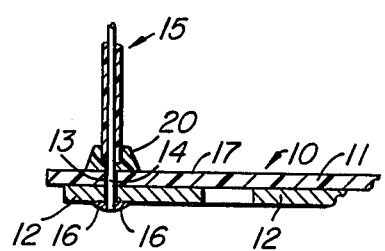
FIG. 4 is a cross-section on the line 4—4 of FIG. 3.

FIGS. 3 and 4 illustrate the attachment of a flexible cable 15 to a PCB 10, both of the same form as in FIGS. 1 and 2, with the application of the present invention. As seen in FIGS. 3 and 4 a strain relief member 20 is positioned on the cable end, the member 20 resting on the top surface 17 of the board. The insulated cable extends part way into the member 20, the bared conductors passing through apertures in the bottom of the member and then through the holes 13 in the PCB. The conductor ends are flow soldered to the conductor pattern in the normal manner. Common references are used in FIGS. 3 and 4 and FIGS. 1 and 2 for the same details.

Figure 5:
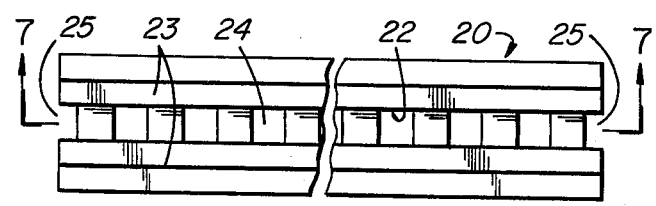
FIGS. 5, 6 and 7 are top plan view, end view and cross-section on the line 7—7 of FIG. 5 respectively.
Figure 6:
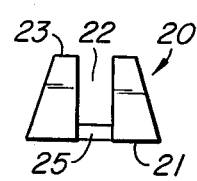
Figure 7:
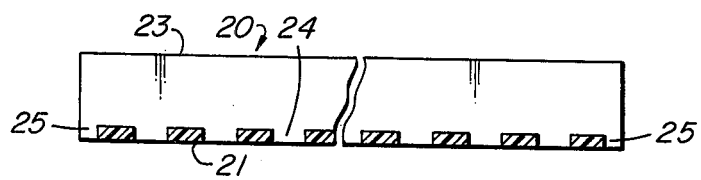

FIGS. 5, 6 and 7 illustrate one form of member 20. In the example, member 20 is of trapezoidal cross-section, as seen in FIG. 6. The particular cross-section is not critical and the trapezoidal cross-section is easy to mold, being easy to extract from the mold. The main requirement is a bottom surface 21 for sitting on the top surface of the PCB. A slot or groove 22 extends down from top surface 23 towards the bottom surface 21 and is of a width to be a fairly close fit on the insulated cable. Extending from the bottom of the groove 22 are a plurality of apertures 24, the apertures extending through to the bottom surface 21.

Conveniently, the apertures 24 are rectangular, i.e. square for ease in making the molding tool, and thus reduce costs, but the apertures can be round or other shape. The pitch of the apertures normally equals the pitch of the conductors in the cable. The apertures are of a size to be a fairly loose fit over uninsulated conductors. The material of the member 20 is of a suitable plastic which is easily molded, an example being acetal. A cable generally comprises a plurality of insulated conductors, united into a flat, ribbon-like form, by a plastic web between conductors.

The number of conductors in a cable can vary widely, for example from five to twenty, or more. To avoid having to stock members for every size of cable, members can be made in a predetermined range, for example with five, seven and ten apertures 24. A half of an aperture is produced at each end of a member, indicated at 25 in FIGS. 5, 6 and 7, enabling members to be butted together to form long assemblies.

The cable, with the individual conductors 14 bared, is assembled to a member 20, or a plurality of members 20, depending upon the number of conductors, and then the conductors pushed through holes in the PCB (13 in FIG. 4). During soldering of the conductors the member, or members, 20 should be held down firmly in contact with the top surface 17 of the PCB and the cable firmly down in the slot or groove 22. The flexure position of the cable is now at the top surface 23 of the member 20, well above any "wicking" of solder and the cable can be flexed many times without breakage problems. The member 20 is not attached of itself to the PCB, being quite free and therefore no preassembly of strain relief member to the board is necessary. The total length of member, or members, can be somewhat more than the width of the cable to permit use of members having other than the exact number of apertures.

A typical set of dimensions for a member are: 5 mm wide at bottom surface 21 tapering to 3 mm at the top surface 23; 3 mm high; groove 22, 1.3 mm wide and 2.5 mm deep; apertures 24, 1.3 mm square. Such dimensions are suitable for cables having insulated conductors of approximately 1.3 mm over the insulation, which are typically 26 AWG stranded conductors, for telephony use. The dimensions are approximate, and can be varied, particularly for different conductor sizes and types.

What is claimed is:

1. A printed circuit board having front and back surfaces;
    a printed circuit pattern on said front surface;
    a plurality of holes extending through the circuit board;
    a strain relief member on said back surface over said holes, said strain relief member having a bottom surface in contact with said back surface of the board, a longitudinal groove extending from a top surface down towards said bottom surface, and a plurality of spaced apertures extending from the bottom of said groove to said bottom surface, each aperture aligned with one of said holes extending through said board, and includng a half aperture at each end of the strain relief member;
    a flat flexible cable attached to said board, said cable comprising a plurality of spaced interconnected insulated conductors, an end portion of each conductor having the insulation removed and the bare conductor extending through an aperture and an aligned hole and connected to the conductor pattern, the end of the insulated portion of the cable positioned in said groove.

2. A printed circuit board as claimed in claim 1, said printed circuit pattern extending over said holes through the circuit board and holes extending through the circuit pattern in alignment with the holes in the circuit board, the bare conductors extending through the holes in the circuit pattern and soldered to the circuit pattern.

3. A printed circuit board as claimed in claim 1, said apertures having a rectangular cross-section in a plane parallel to said bottom surface of the relief member.

4. A printed circuit board as claimed in claim 1, including a plurality of relief members on said back surface, in butting relationship, the half apertures at the butting ends of adjacent members forming a complete aperture for a conductor.

5. A strain relief member for use in connecting a flat flexible cable to a printed circuit board, the member having spaced apart top and bottom surfaces, a longitudinal groove extending down from said top surface towards said bottom surface, and a plurality of spaced apertures extending from the bottom of said groove to said bottom surface, for passage of conductors of said cable therethrough, and including a half aperture at each end of the member.

6. A strain relief member as claimed in claim 6, said apertures having a rectangular cross-section in a plane parallel to said bottom surface.

7. A strain relief member as claimed in claim 6, having a trapezoidal cross-section, viewed at one end, said bottom surface wider than the top surface.

* * * * *